US009083908B2

(12) United States Patent
Yamashita et al.

(10) Patent No.: US 9,083,908 B2
(45) Date of Patent: Jul. 14, 2015

(54) SOLID-STATE IMAGING APPARATUS WITH EACH PIXEL INCLUDING A PHOTOELECTRIC CONVERSION PORTION AND PLURAL HOLDING PORTIONS

(71) Applicant: CANON KABUSHIKI KAISHA, Tokyo (JP)

(72) Inventors: Yuichiro Yamashita, Ebina (JP); Masahiro Kobayashi, Tokyo (JP); Takanori Watanabe, Yamato (JP); Shinsuke Kojima, Atsugi (JP); Takeshi Ichikawa, Hachioji (JP); Yusuke Onuki, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 330 days.

(21) Appl. No.: 13/832,283

(22) Filed: Mar. 15, 2013

(65) Prior Publication Data

US 2013/0206964 A1    Aug. 15, 2013

Related U.S. Application Data

(62) Division of application No. 12/933,471, filed as application No. PCT/JP2009/058791 on Apr. 30, 2009, now Pat. No. 8,625,010.

(30) Foreign Application Priority Data

May 2, 2008  (JP) ................................. 2008-120408

(51) Int. Cl.
H01L 27/146 (2006.01)
H04N 5/378 (2011.01)
(Continued)

(52) U.S. Cl.
CPC .......... *H04N 5/378* (2013.01); *H01L 27/14609* (2013.01); *H01L 27/14641* (2013.01);
(Continued)

(58) Field of Classification Search
CPC ................... H01L 27/14609; H01L 27/14643; H04N 3/155
See application file for complete search history.

(56) References Cited

U.S. PATENT DOCUMENTS 4,737,854 A    4/1988  Tandon et al.
5,304,803 A    4/1994  Sakaino et al.
(Continued)

FOREIGN PATENT DOCUMENTS

EP    1098512 A2    5/2001
EP    1589583 A2    10/2005
(Continued)

OTHER PUBLICATIONS

Nov. 10, 2009 International Search Report and Written Opinion in International Patent Appln. No. PCT/JP2009/058791.
(Continued)

*Primary Examiner* — Tony Ko
(74) *Attorney, Agent, or Firm* — Fitzpatrick, Cella, Harper & Scinto

(57) ABSTRACT

A solid-state imaging apparatus including a plurality of pixels each including: a first holding portion for holding signal carriers from a photoelectric conversion portion; an amplifying portion for amplifying and reading a signal based on the signal carriers generated in the photoelectric conversion portion; and a carrier discharging control portion for discharging charge carriers in the photoelectric conversion portion to an OFD region, and having a carrier path between the photoelectric conversion portion and the first carrier holding portion, in which the solid-state imaging apparatus further includes a second carrier holding portion electrically connected with the first carrier portion in parallel through a first transfer unit, when viewed from an output node of the photoelectric conversion portion, thereby smoothing an movie imaging without causing discontinuous frame while suppressing generation of noise mixing into the charge carrier holding portion.

4 Claims, 14 Drawing Sheets

(51) Int. Cl.
*H04N 5/359* (2011.01)
*H04N 5/3745* (2011.01)

(52) U.S. Cl.
CPC ............ *H04N5/359* (2013.01); *H04N 5/37452* (2013.01); *H04N 5/37457* (2013.01); *H01L 27/14603* (2013.01); *H01L 27/14643* (2013.01)

(56) References Cited

U.S. PATENT DOCUMENTS

| | | | |
|---|---|---|---|
| 6,040,568 | A | 3/2000 | Caulfield et al. |
| 7,116,365 | B1 | 10/2006 | Ueno et al. |
| 7,227,206 | B2 | 6/2007 | Watanabe |
| 7,569,868 | B2 | 8/2009 | Watanabe et al. |
| 8,723,999 | B2 * | 5/2014 | Kido et al. .............. 348/300 |
| 8,792,035 | B2 * | 7/2014 | Yamada .................. 348/308 |
| 8,817,154 | B2 * | 8/2014 | Manabe et al. ............ 348/308 |
| 2001/0007471 | A1 | 7/2001 | Beiley |
| 2004/0051801 | A1 | 3/2004 | Iizuka et al. |
| 2005/0052554 | A1 | 3/2005 | Sakurai et al. |
| 2005/0110884 | A1 | 5/2005 | Altice, Jr. et al. |
| 2005/0219884 | A1 | 10/2005 | Manabe et al. |
| 2006/0266922 | A1 | 11/2006 | McGrath et al. |
| 2008/0084489 | A1 | 4/2008 | Kishi et al. |
| 2009/0015690 | A1 | 1/2009 | Yamashita |
| 2009/0219418 | A1 | 9/2009 | Fujita |
| 2009/0244340 | A1 | 10/2009 | Watanabe et al. |
| 2009/0251582 | A1 | 10/2009 | Oike |
| 2010/0118167 | A1 * | 5/2010 | Johnson .................. 348/294 |

FOREIGN PATENT DOCUMENTS

| | | |
|---|---|---|
| GB | 2270228 | 3/1994 |
| JP | 2004-087898 A | 3/2004 |
| JP | 2006-217410 A | 8/2006 |
| JP | 2006-246450 A | 9/2006 |
| JP | 2006-262070 A | 9/2006 |
| WO | 02/29895 A1 | 4/2002 |
| WO | 2008/027193 A2 | 3/2008 |

OTHER PUBLICATIONS

Nov. 2, 2010 International Preliminary Report on Patentability in International Patent Appln. No. PCT/JP2009/058791.

Jan. 31, 2012 Chinese Official Action in Chinese Patent Appln. No. 200980115090.6.

Dec. 6, 2012 Chinese Official Action in Chinese Patent Appln. No. 200980115090.6.

* cited by examiner

FIG. 2A

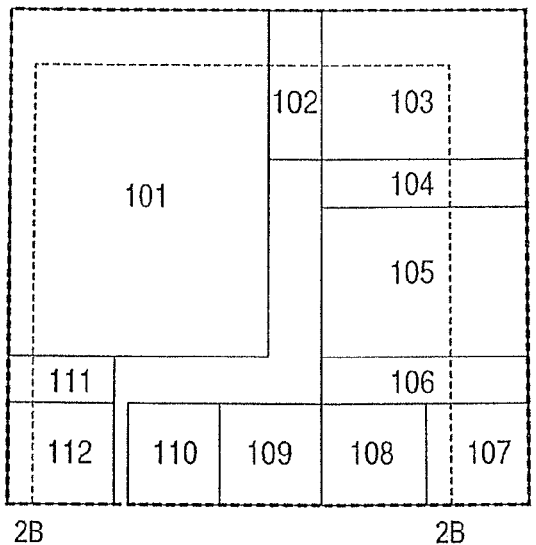

- 101 Photoelectric conversion portion
- 102 Charge carrier transfer portion
- 103 First charge carrier holding portion
- 104 First transfer portion
- 105 Second charge carrier holding portion
- 106 Second transfer portion
- 107 Input node
- 108 Resetting portion
- 109 Amplifying portion
- 110 Selection portion
- 111 Charge carrier discharging control portion

FIG. 2B

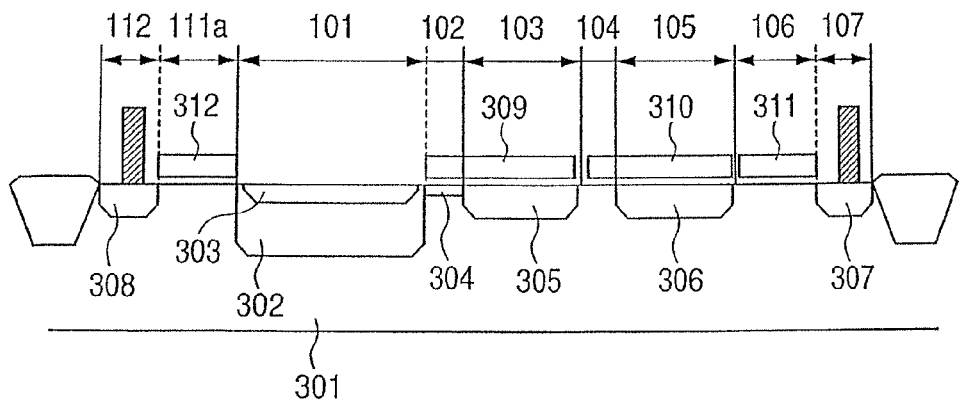

- 301 P-type semiconductor region
- 302 N-type semiconductor region
- 303 P-type semiconductor region
- 304 Charge carrier path
- 305 N-type semiconductor region
- 306 N-type semiconductor region
- 307 Floating diffusion region
- 308 Overflow drain region
- 309 First control electrode
- 310 Second control electrode
- 311 Third control electrode
- 312 Charge carrier discharging control electrode

SOLID-STATE IMAGING APPARATUS WITH EACH PIXEL INCLUDING A PHOTOELECTRIC CONVERSION PORTION AND PLURAL HOLDING PORTIONS This application is a division of application Ser. No. 12/933,471 filed Sep. 20, 2010, which was the National Stage of International Application No. PCT/JP2009/058791 filed Apr. 30, 2009.

TECHNICAL FIELD

The present invention relates to a solid-state imaging apparatus and, in particular, a solid-state imaging apparatus provided with pixels, each of which has a charge carrier holding portion capable of an electronic shutter operation.

BACKGROUND ART

Conventionally, as a solid-state imaging apparatus provided with pixels, each of which has a charge carrier holding portion capable of an electronic shutter operation, there is known configurations disclosed in Japanese Patent Application Laid-Open Nos. 2006-262070 and 2006-246450.

Japanese Patent Application Laid-Open No. 2006-262070 discloses a configuration which has a shutter controller to perform switching between a first mode of transferring charge carriers of a photodiode to a power supply and a second mode of transferring charge carriers generated in the photodiode to a capacitor through a MOS transistor.

Japanese Patent Application Laid-Open No. 2006-246450 discloses a configuration which transfers a part of charges generated in a photoelectric conversion portion to a charge carrier accumulating region at a part of a photoelectric conversion period.

For example, in the case of a configuration which transfers a signal carrier generated in a photoelectric conversion period to a charge carrier accumulating region during a photoelectric conversion period as is described in Japanese Patent Application Laid-Open Nos. 2006-262070 and 2006-246450, the following problems may occur: Reading out a signal based on charge carriers held in the charge carrier accumulating region to a common output line is line-sequential. In this case, holding charge carriers in the charge carrier accumulating region is required until a scanning unit selects a pixel and reads out a signal at the common output line. In launching light into the photoelectric conversion portion under such a state, a charge may be moved into the charge carrier accumulating region. When such a charge carrier movement occurs, noise occurs because a charge carrier generated during a different period from a basic photoelectric conversion period is mixed. Because the charge carrier mixing amount varies with the time held in the charge carrier accumulating region, noise appears as image shading and is visually recognized with ease. The noise is unpreferable for image quality.

DISCLOSURE OF THE INVENTION

In view of the foregoing problems, it is an object of the present invention to suppress noise mixing into a charge carrier accumulating region, for example, in a configuration which transfers charge carriers to a charge carrier accumulating portion during a photoelectric conversion period.

According to the present invention, there is provided a solid-state imaging apparatus including a plurality of pixels each including: a photoelectric conversion portion; a first holding portion for holding signal carriers from the photoelectric conversion portion; an amplifying portion for amplifying and reading a signal based on the signal carriers generated in the photoelectric conversion portion; and a carrier discharging control portion for controlling an electrical connection between the photoelectric conversion portion and an overflow drain region, in which a carrier path between the photoelectric conversion portion and the first holding portion is formed in a buried channel structure, and in which a second holding portion is arranged through a first transfer portion between the first holding portion and the amplifying portion.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

BRIEF DESCRIPTION OF THE DRAWING

FIGS. 2A and 2B are a top view and a sectional view of a solid-state imaging apparatus according to the first embodiment, respectively.

BEST MODES FOR CARRYING OUT THE INVENTION

Preferred embodiments of the present invention will now be described in detail in accordance with the accompanying drawings.

First Embodiment

Figure 1:
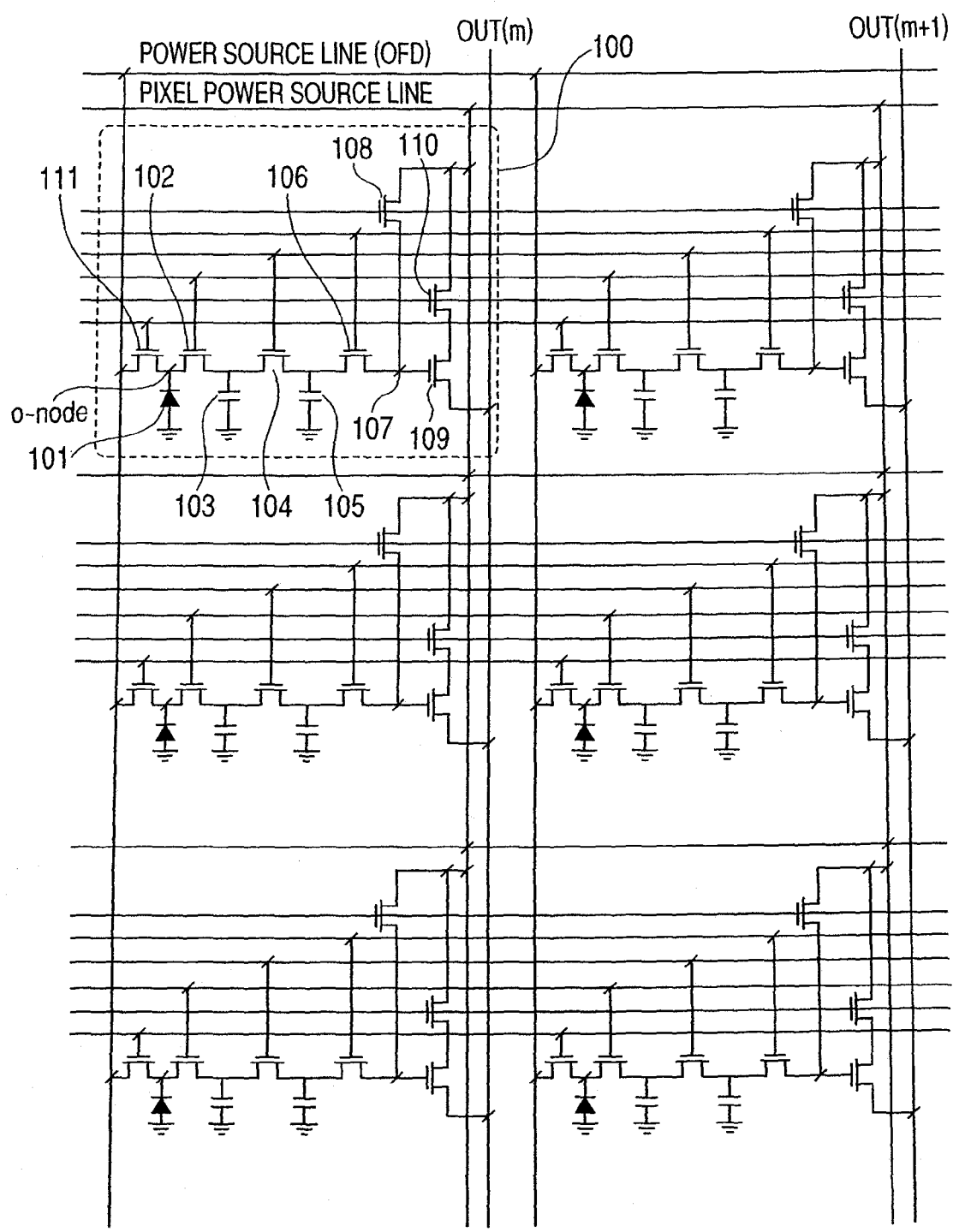
FIG. 1 is an equivalent circuit diagram of a solid-state imaging apparatus according to a first embodiment.

FIG. 1 is an equivalent circuit diagram of a solid-state imaging apparatus according to the present embodiment and illustrates 6 pixels, however, the solid-state imaging apparatus may be configured to have a plurality of more pixels.

The photoelectric conversion portion 101 illustrates a photodiode herein as an example. The output node O-node is an output node of the photoelectric conversion portion. The charge carrier transfer portion 102 is configured to transfer a signal carrier generated in the photoelectric conversion portion 101 to a circuit element at a subsequent stage. The first charge carrier holding portion 103 is configured to hold a signal carrier generated in the photoelectric conversion portion. The first transfer portion 104 is configured to transfer a signal carrier held in the first charge carrier holding portion to a circuit element at a subsequent stage. The second charge carrier holding portion 105 is configured to hold a signal carrier transferred from the first charge carrier holding portion through a first transfer portion. The second transfer portion 106 is configured to transfer a signal carrier held in the second charge carrier holding portion to a circuit element at a subsequent stage.

The input node 107 is an input node of an amplifying portion to be described later and is configured to hold a signal carrier to be transferred through a second transfer portion from a second charge carrier holding portion. The input node can use, for example, a floating diffusion region (FD region) distributed to a semiconductor substrate. The resetting portion 108 is configured to supply a reference voltage to the input node 107 of the amplifying portion. The amplifying portion 109 amplifies a signal based on a signal carrier transferred to the FD region and reads the amplified signal to the outside. As an example, there is a source follower circuit using a MOS transistor. The amplifying portion may use such a configuration that a gate of the MOS transistor and the FD region are electrically connected to each other.

The selection portion 110 is configured to select each pixel and read the selected pixel to the outside for each pixel or for each pixel row. The charge carrier discharging control portion 111 is capable of discharging charges of the photoelectric conversion portion 101 and may use, for example, a MOS transistor as the photoelectric conversion portion. In this case, the carrier discharging control portion is configured in such a manner that a semiconductor region having the same polarity as a signal carrier constituting a part of the photoelectric conversion portion is taken as a source and a semiconductor region (overflow drain region: OFD region) supplied with a power supply voltage is taken as drain.

Each of the transfer portion, the resetting portion, the selection portion and the charge carrier discharging control portion may use a MOS transistor.

The present invention is characterized by a structure of a charge carrier path between the photoelectric conversion portion and the charge carrier holding portion. The charge carrier transfer portion is configured to transfer a charge from the photoelectric conversion portion to the first charge carrier holding portion under a state in which a voltage causing the charge transfer portion to be in a non-conduction state is supplied.

For example, as a concrete configuration, the charge carrier transfer portion is of a MOS transistor. The MOS transistor constitutes a buried channel structure. This configuration includes a portion in which an energy barrier is positioned to be lower in a portion deeper than a surface even under a non-conduction state. In this case, the charge carrier transfer portion can also keep a constant voltage to be in a supplied state without any positive control. Specifically, a stationary potential barrier may be provided without need of having a function serving as the transfer portion.

Such a configuration allows most of signal carriers generated by photoelectric conversion when light is launched into the photoelectric conversion portion to be transferred to the first charge carrier holding portion without any accumulation in the photoelectric conversion portion. Accordingly, the photoelectric conversion portion included in all pixels allows charge carrier accumulating time to be unified. When the MOS transistor is in a non-conduction state, a hole is stored in a channel surface and a channel to which charge carriers are transferred exists in a portion at a predetermined depth from the surface and therefore an adverse effect of a dark current can be suppressed at an insulation film interface.

From another viewpoint, during a period in which the photoelectric conversion portion and the charge carrier holding portion accumulate signal carriers, it may be said that a potential of a charge carrier path between the photoelectric conversion portion and the charge carrier holding portion is lower than that of a charge carrier path between the photoelectric conversion portion and an OFD region. The potential used herein is a potential for a signal carrier.

From the viewpoint of drive, a charge carrier moved to the first charge carrier holding portion from the photoelectric conversion portion during one exposure period is held in the first charge carrier holding portion and used as an image signal. Specifically, it may be said that after start of one exposure period by the photoelectric conversion portion, a signal is read out to the pixel outside without any reset operation of the charge carrier holding portion. One exposure period used herein refers to the one determined in common by the each photoelectric conversion portion when a one-frame image is taken.

Further, the solid-state imaging apparatus according to the present embodiment is configured in such a manner that the plurality of charge carrier holding portions are connected in parallel to the respective photoelectric conversion portions when viewed from an output node of the photoelectric conversion portion through the transfer portion. Such a configuration is effective, particularly to a case where the photoelectric conversion portion, the charge carrier holding portion and the charge carrier path therebetween are in a state described above. Description of the advantages of the configuration of the present embodiment will be made, as a comparative example, on a case where moving image shooting is performed in a configuration having only one charge carrier holding portion relative to the photoelectric conversion portion.

During a period at which light is launched into the photoelectric conversion portion as described above, a predetermined amount of signal carriers generated by photoelectric conversion move from the photoelectric conversion portion to the charge carrier holding portion. However, the charge carrier holding portion may have a state where a signal carrier of a previous frame is held. This is because the signal carrier is required to be held for a fixed period by the charge carrier holding portion until a selection operation is performed for reading out to the outside for each pixel row. When a signal carrier generated by the photoelectric conversion portion is mixed into the charge carrier holding portion under such a state, the mixed charge is a signal carrier generated during a period which is not an original exposure period (a charge of a following frame), which causes a noise. To prevent the charge which is a cause for a noise from being mixed into the charge carrier holding portion, during a period at which the charge carrier holding portion is holding a charge, the charge carrier discharging control portion requires to discharge a signal carrier generated by the photoelectric conversion portion to an OFD region. Hence, mixing of a charge into the charge carrier holding portion can be inhibited. However, if such an operation is performed, such a state where image information is missing will be made during a period at which a charge carrier is being discharged from a charge carrier discharging control portion. Therefore, a moving image tends to be taken with discontinuous frame in performing moving image shooting.

On the other hand, in a configuration of the present embodiment, installation of a plurality of charge carrier holding portions (a first and a second charge carrier holding portions) in the photoelectric conversion portion allows continuous moving image shooting. Specifically, during a period at which the photoelectric conversion portion and the first charge carrier holding portion hold a signal carrier generated by the photoelectric conversion portion, the second charge carrier holding portion can hold a charge until a pixel row is sequentially selected.

FIGS. 2A and 2B illustrate a top view and a sectional view of a solid-state imaging apparatus according to the present embodiment, respectively. Portions having similar functions to those in FIG. 1 have the same reference numerals/characters and detailed description will not be repeated. In the top view of FIG. 2A, each region is rectangular for easy description, which indicates that each configuration is not always rectangular and, in the region, at least the each configuration is disposed. Other embodiments are applicable in the same way. Only one pixel is illustrated, however, such a plurality of pixels is disposed to constitute a pixel region.

In the present embodiment, within the same pixel, the first charge carrier holding portion 103 is disposed in a first direction (right-hand in Figure) relative to the photoelectric conversion portion 101. The FD region 107 is arranged in a second direction (downward in Figure) orthogonal to the first direction, relative to the first charge carrier holding portion 103. Such a configuration allows reduction in layout.

FIG. 2B illustrates a sectional view taken along line 2B-2B in FIG. 2A.

The following description will be made on a case where a conductivity type of a semiconductor region uses an electron as a signal carrier. In using a hole, it is sufficient to take a conductivity type of the each semiconductor region as an opposite-conductivity type. Other embodiments are applicable in the same way.

The p-type semiconductor region 301 can be formed by injecting a p-type impurity ion into an n-type semiconductor substrate. Otherwise, a p-type semiconductor substrate may be used.

The n-type semiconductor region (a first semiconductor region of a first conductivity type) 302 constitutes a part of the photoelectric conversion portion and has the same polarity as an electron which is a signal carrier, where a PN junction is constituted with the p-type semiconductor region 301 (a second semiconductor region of a second conductivity type).

The p-type semiconductor region 303, provided on a surface of the n-type semiconductor region 302 to use an embedded type photodiode as the photoelectric conversion portion, suppresses an adverse effect of an interface state and a dark current generated on a surface of the photoelectric conversion portion. The photoelectric conversion portion includes at least the p-type semiconductor region 301 and the n-type semiconductor region 302 constituting a PN junction with the p-type semiconductor region 301.

The charge carrier path 304 is between the n-type semiconductor region 302 and an n-type semiconductor region 305 to be described later, where an n-type impurity with low concentration is doped to constitute a buried channel structure.

The n-type semiconductor region (a third semiconductor region of the first conductivity type) 305 constitutes a part of the first charge carrier holding portion 103 and is configured to accumulate a charge transferred from the photoelectric conversion portion 101 for a fixed period.

The n-type semiconductor region (a fourth semiconductor region of a first conductivity type) 306 constitutes a part of the second charge carrier accumulating portion 105 and is configured to accumulate a charge transferred from the first charge carrier holding portion 103 for a fixed period.

The first conductivity type floating diffusion region (FD region) 307 functions as a charge carrier-to-voltage conversion portion and is electrically connected with a gate of an amplifying MOS transistor through a plug or the like.

The overflow drain region 308 is a first conductivity type OFD region.

The first control electrode 309 is disposed on the third semiconductor region 305 through an insulation film and can control a potential state of a region in proximity to an interface of the insulation film on the third semiconductor region 305. By supplying a voltage to the first control electrode 309 during a period at which the charge carrier holding portion is holding a charge, an adverse effect of dark current generated in vicinity to an interface to surface oxide film of the n-type semiconductor region 305 can be suppressed. The first charge carrier holding portion 103 includes the n-type semiconductor region 305 and the first control electrode 309.

The first control electrode 309 is disposed, extending to the n-type semiconductor region 304 and has a function as a transfer electrode, which may be provided separately from each other.

The second control electrode 310 is arranged on the fourth semiconductor region 306 through an insulation film and can control a potential state of a region in proximity to an interface of the insulation film on the fourth semiconductor region 306. By supplying a voltage to the second control electrode 310 during a period at which the second charge carrier holding portion is holding a charge, an adverse effect of dark current generated in vicinity to an interface to surface oxide film of the n-type semiconductor region 306 can be suppressed. The second charge carrier holding portion 105 includes the n-type semiconductor region 306 and the second control electrode 310.

The second control electrode 310 is disposed, extending to the n-type semiconductor regions 305, 306 and has a function as a transfer electrode, which may be provided separately from each other.

The third control electrode 311 is configured to control a potential state of a charge carrier path between the n-type semiconductor region 306 and the FD region 307.

The charge carrier discharging control electrode 312 is configured to control a potential of a charge carrier path between the n-type semiconductor region 302 and the OFD region 308 constituting the photoelectric conversion portion.

Figure 3:
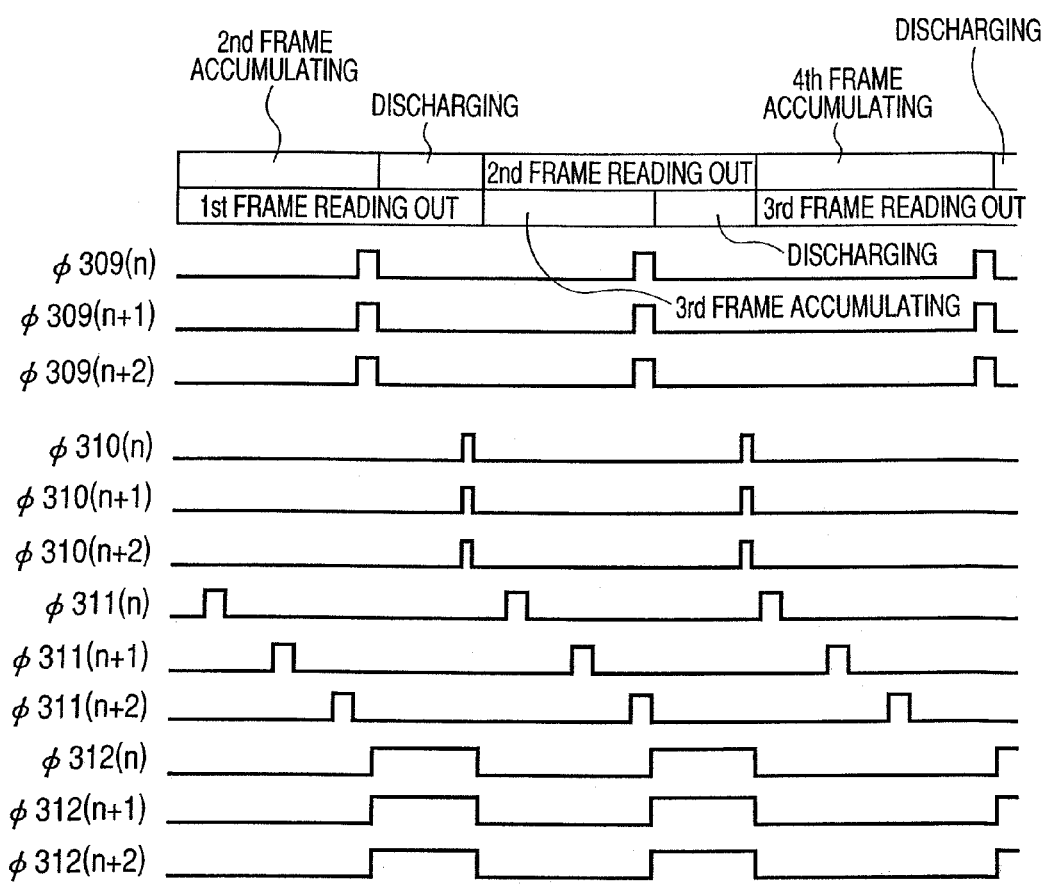
FIG. 3 is a driving pulse pattern of the solid-state imaging apparatus according to the first embodiment.

Referring next to FIG. 3, a driving method according to the present embodiment will be described below. FIG. 3 illustrates a progress in time series of a driving pulse supplied to each of the control electrode and the transfer electrode in FIGS. 1, 2A and 2B. Reference numerals/characters are the same as those in FIGS. 2A and 2B. Suffixes of respective control lines show (n)th, (n+1)th and (n+2)th rows. Description will be made on only three rows herein, however, the present invention is applicable to a case of more than three rows by repeating the driving pattern and is highly active.

First, a state where a first frame accumulating period is completed and the second charge carrier holding portion is holding a first frame signal carrier is taken as an initial state.

First, a pulse which keeps the second transfer portion of each pixel row to be in an electrical connection state is supplied in the order of Φ311(n), Φ311(n+1) and Φ311(n+2) and thereby the charge carrier held by the second charge carrier holding portion is transferred to an input portion of an amplifying portion and the selection portion is brought into an electrical connection to read out a signal to the outside. This is a first frame reading-out operation. During the first frame reading-out operation, light is launched into the photoelectric conversion portion for photoelectric conversion, thus creating a second frame accumulating period. A second frame signal carrier is accumulated in the photoelectric conversion portion and the first charge carrier holding portion.

Next, Φ309 is concurrently brought into electrical connection for all pixel rows to complete the second frame accumulating period. Next, Φ312 is concurrently brought into electrical connection for all pixel rows, thus creating a discharging period for discharging the charge carrier generated by the photoelectric conversion portion to the OFD region.

Next, Φ310 is brought into electrical connection in a collective manner and the signal carrier of the second frame held by the first charge carrier holding portion is transferred to the second charge carrier holding portion. Φ311 is brought into electrical connection in row order and charge carrier transfer is made from the second charge carrier holding portion to the input node of the amplifying portion. By adjusting Φ309 and Φ312 as needed, an exposure period of the each frame can be changed. Repeating this operation allows moving image shooting. Shortening an interval for bringing Φ309 and Φ310 into electrical connection can further lengthen an exposure period.

As described above, the present embodiment provides shooting by an electronic shutter operation without any break of shooting time in such a configuration that a signal carrier moves and is accumulated in the charge carrier holding portion during an exposure period.

Second Embodiment

A difference of the present embodiment from the first embodiment is that between charge carrier holding portions adaptable to a plurality of photoelectric conversion portions, there is disposed a charge carrier path through which charges are made movable therebetween. Specifically, the present embodiment includes at least one charge carrier holding portion provided for each photoelectric conversion portion and is configured in such a manner that at least one charge carrier holding portion is shared by the plurality of photoelectric conversion portions or pixels. Such a configuration provides further reductions in an element area and a pixel pitch than the first embodiment.

Figure 4:
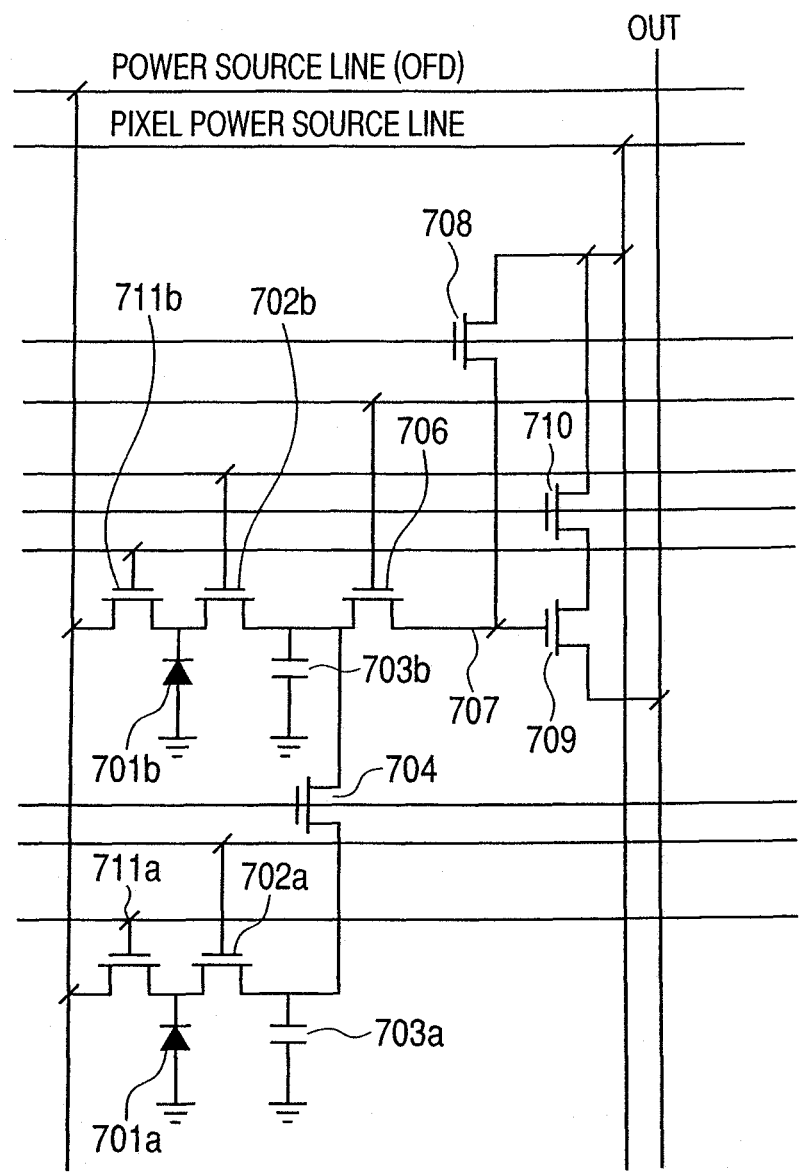
FIG. 4 is an equivalent circuit diagram of a solid-state imaging apparatus according to a second embodiment.

FIG. 4 illustrates an equivalent circuit diagram of a solid-state imaging apparatus according to the present embodiment. Suffixes "a" and "b" indicate that to which of photoelectric conversion portions illustrated in FIGS. 5A to 5C each configuration correspond.

In addition, there are also provided the photoelectric conversion portions 701a, 701b, the first transfer portions 702a, 702b, the first charge carrier holding portions 703a, 703b and the second transfer portion 704. When viewed from the photoelectric conversion portion 702b, the first charge carrier holding portions 703a, 703b are connected in series through the second transfer portion 704. Further, there are also provided the third transfer portion 706, the input node of an amplifying portion 707, the resetting portion 708, the amplifying portion 709 and the selection portion 710. A member having the same name as that in the first embodiment has a similar function and detailed description will not be repeated.

Figure 5A:
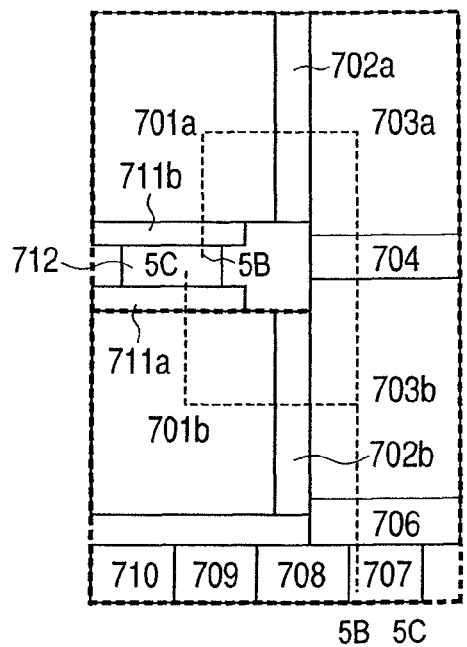
FIGS. 5A, 5B and 5C are a top view and sectional views of a solid-state imaging apparatus according to the second embodiment, respectively.
Figure 5B:
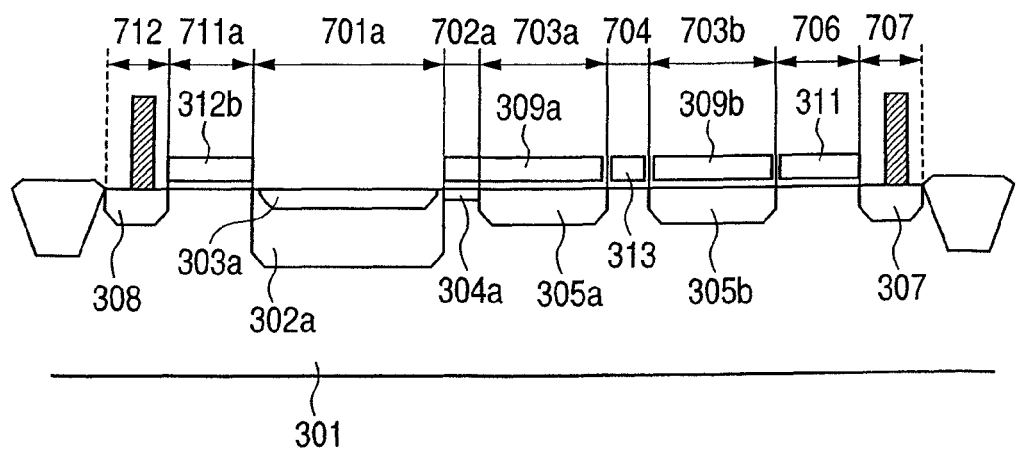
Figure 5C:
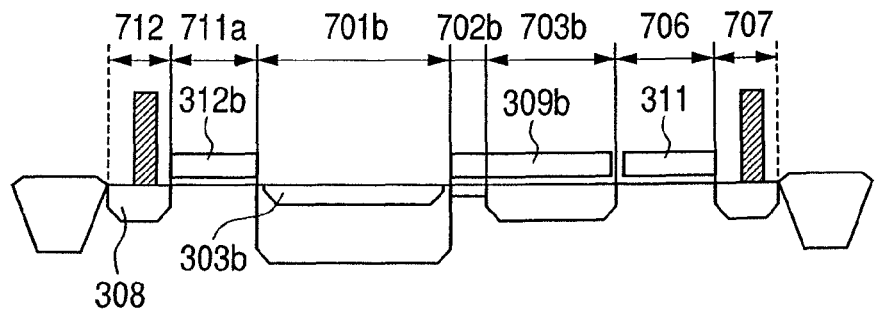

Next, FIG. 5A illustrates a top view of a solid-state imaging apparatus according to the present embodiment, FIG. 5B illustrates a sectional view taken along line 5B-5B in FIG. 5A. And, FIG. 5C illustrates a sectional view taken along line 5C-5C in FIG. 5A. The similar configurations to that in FIG. 4 have the same reference numerals/characters and detailed description will not be repeated.

The first transfer portion 702 is disposed in a region between the photoelectric conversion portion 701 and the first charge carrier holding portion 703. The first charge carrier holding portion 703 is provided for the respective photoelectric conversion portions. The second transfer portion 704 controls a potential of a charge carrier path between the two first charge carrier holding portions 703a, 703b. According to the present embodiment, the second transfer portion 704 allows the first charge carrier holding portion 703a adaptable to the first photoelectric conversion portion 701a to be used as a second charge carrier holding portion in reading out a signal based on a signal carrier generated by the second photoelectric conversion portion 701b. The control electrode 313 constitutes a second transfer portion. In the present embodiment, the control electrode 313 constituting the second transfer portion 704 is provided, electrically separated from a control electrode 309a. A potential state of a charge carrier path between the first charge carrier holding portion 703a and the second charge carrier holding portion 703b is controllable. More specifically, a potential state of a semiconductor region between n-type semiconductor regions 305, 306 is controlled.

Figure 6:
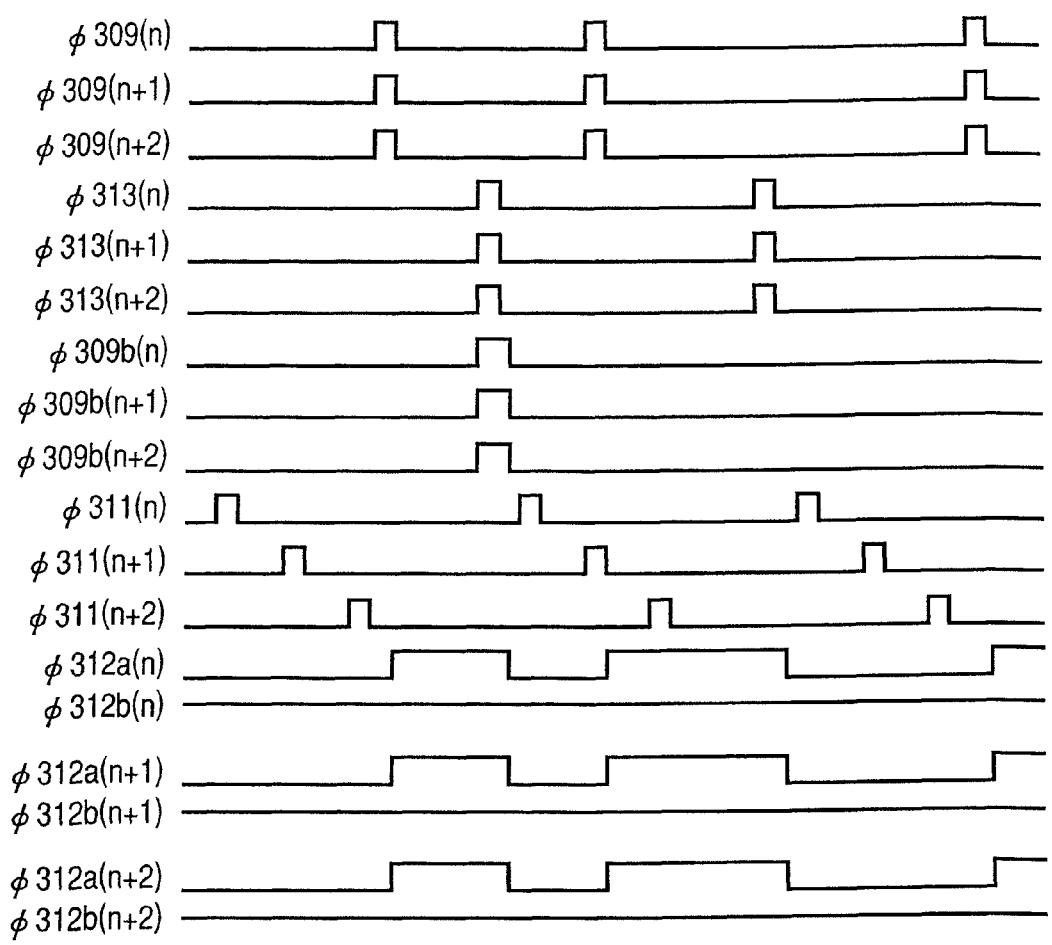
FIG. 6 illustrates an example of a driving pulse pattern of the solid-state imaging apparatus according to the second embodiment.

Referring next to FIG. 6, a driving method of the present embodiment will be described below. Each supply pulse is a pulse supplied to each control electrode in FIGS. 5A to 5C. The suffix "n" is the number of pixel rows, where a unit constituted by disposing a plurality of units including two photoelectric conversion portions perpendicularly adjacent to each other in a horizontal direction is taken as one pixel row. Use of a plurality of more rows is applicable by repeating the driving pattern, which is highly active.

First, as an initial state, a first-frame signal is accumulated in the second charge carrier holding portion 703b. In this state, by bringing Φ311 into electrical connection for each pixel row, the charge carrier held by the second charge carrier holding portion is transferred to an input portion of the amplifying portion. By bringing a selection portion into electrical connection, a signal is read out to the outside. This is a first-frame reading-out operation. Description will be made on Φ312 supplied to a charge carrier discharge control electrode during a first-frame reading-out period. Φ312a, that is, a charge carrier discharging control portion adaptable to a first photoelectric conversion portion is in a non-conduction state, while Φ312b, that is, the charge carrier discharging control portion adaptable to a second photoelectric conversion portion is in an electrical connection state. Specifically, the signal carrier generated by the first photoelectric conversion portion is in a usable state as an image signal, while the signal carrier generated by the second photoelectric conversion portion 701b is in a discharging state to an OFD region. The signal carrier generated by the first photoelectric conversion portion 701a is used as a second-frame image signal. Next, when first-frame signal reading-out has been completed after lapse of a predetermined time with Φ311(n+2) in a non-conduction state, Φ309a is brought into electrical connection in a collective manner and charge carriers of the first photoelectric conversion portion 701a are transferred to the first charge carrier holding portion 703a. Subsequently, a charge carrier discharging control portion 312a adaptable to the first photoelectric conversion portion 701a is brought into electrical connection. Because all charge carrier discharging control portions are in an electrical connection state, the signal carrier generated during this period is discharged to the OFD region. By bringing Φ313 into electrical connection after lapse of a predetermined period, a charge carrier of the first charge carrier holding portion 703a is transferred to the second charge carrier holding portion 703b. At this time, Φ309b is also concurrently brought into electrical connection. Subsequently, by sequentially bringing Φ311 into electrical connection, a charge carrier is transferred to the input portion of the amplifying portion. By bringing the selection portion into electrical connection, a signal is read out to the outside. This is a second-frame reading-out operation. During a period at which Φ311 is sequentially brought into electrical connection, Φ309 and Φ312a are brought into electrical connection in order. This operation can determine accumulating periods of the first photoelectric conversion portion 701a and the first charge carrier holding portion 702a. Specifically, it is sufficient to change a timing for bringing Φ309 and Φ312a into electrical connection, depending upon an accumulating period of each frame. Continuous implementation of such operations allows moving image shooting.

In a driving operation illustrated in FIG. 6, shooting is made, using a signal carrier generated by at least either one of the two photoelectric conversion portions.

Figure 7:
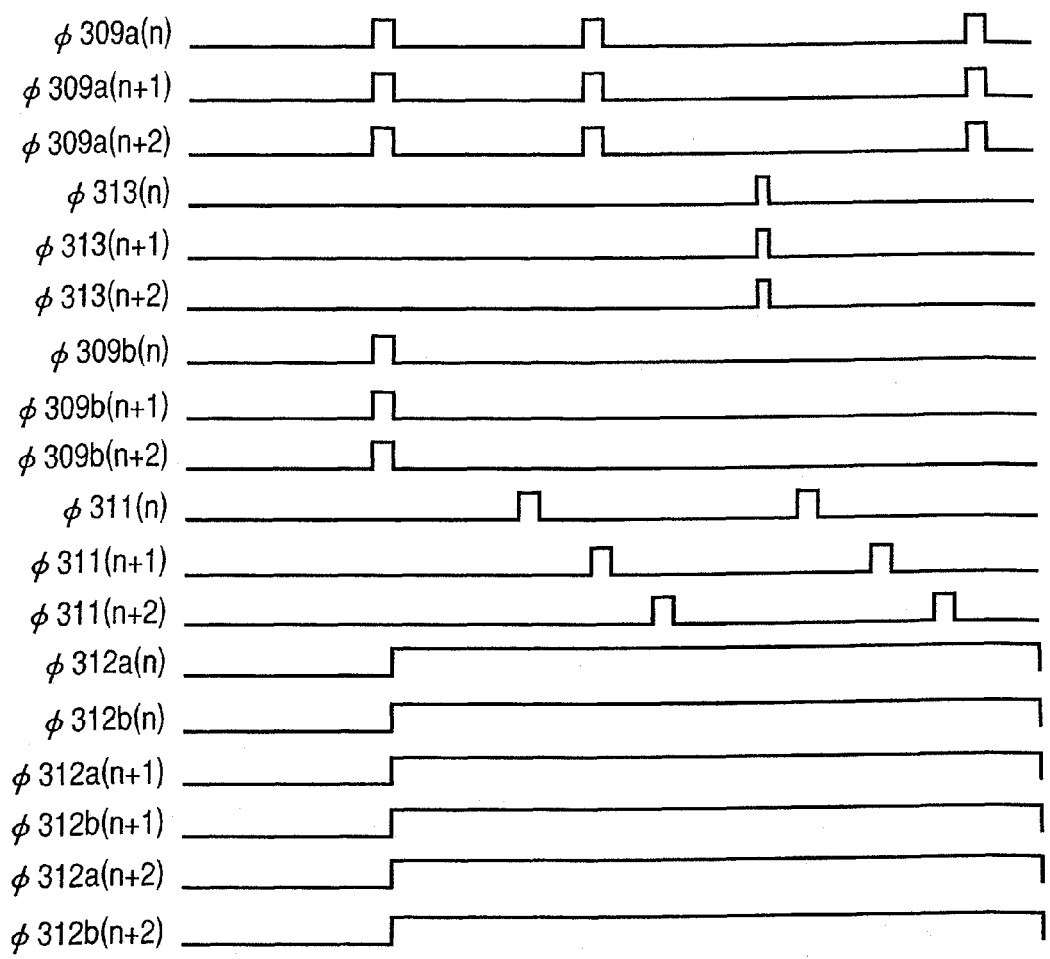
FIG. 7 illustrates an example of a driving pulse pattern of the solid-state imaging apparatus according to the second embodiment.

FIG. 7 illustrates other driving methods using configurations in FIGS. 4 and 5A to 5C. In FIG. 6, all the signal carriers generated by the second photoelectric conversion portion are discharged to the OFD region by the charge carrier discharging control portion, however, in FIG. 7, the signal carrier generated by the second photoelectric conversion portion is used as a signal for image. With Φ312 kept in a non-conduction state, charges are accumulated, using the first and the second photoelectric conversion portions and the first charge carrier holding portion. By bringing Φ309 into electrical connection in a collective manner after lapse of predetermined period, charge transfer is made from the photoelectric conversion portion to the first charge carrier holding portion and concurrently Φ312 is brought into electrical connection and the charge generated by the photoelectric conversion portion is discharged to the OFD region. By sequentially bringing Φ311 into electrical connection, a signal based on the signal carrier generated by the second photoelectric conversion portion is read out. When Φ313 has been brought into electrical connection after completion of the reading-out, Φ311 is sequentially brought into electrical connection again to read out a signal based on the signal carrier generated by the first photoelectric conversion portion. A driving method in FIG. 7 provides higher-quality shooting than in FIG. 6 because signals of all the photoelectric conversion portions are available. Accordingly, the driving method is suitable, particularly in performing still image shooting.

The driving methods in FIGS. 6 and 7, if configured in a solid-state imaging apparatus to have a first drive mode and a second drive mode and to be switchable therebetween as needed, provides shooting suitable for both a moving image and a still image.

The present invention provides continuous moving image shooting while, for example, suppressing noise from being mixed into a charge carrier holding portion provided in a pixel.

Third Embodiment

Figure 8:
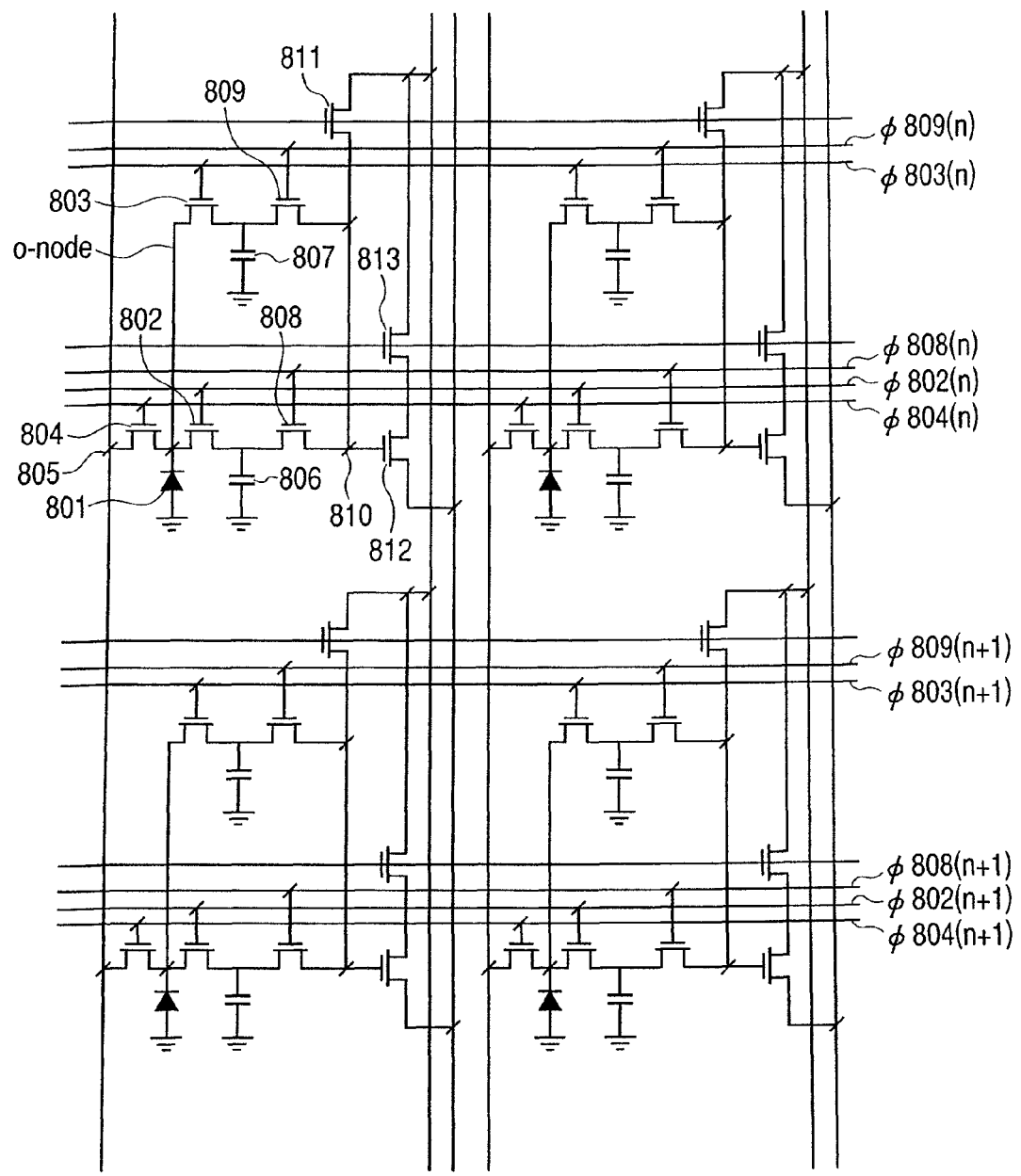
FIG. 8 is an equivalent circuit diagram of a solid-state imaging apparatus according to the third embodiment.

FIG. 8 is an equivalent circuit diagram of a solid-state imaging apparatus according to the present embodiment and illustrates 4 pixels, however, the solid-state imaging apparatus may be configured to have a plurality of more pixels.

The photoelectric conversion portion 801 illustrates a photodiode as an example. The output node O-node is an output node of the photoelectric conversion portion. The first and the second charge carrier transfer portion 802, 803 are configured to transfer a signal carrier generated in the photoelectric conversion portion 801 to a circuit element at a subsequent stage. The charge carrier discharging control portion 804 is capable of discharging charges of a photoelectric conversion portion 801 and may use, for example, a MOS transistor as the photoelectric conversion portion. In this case, the carrier discharging control portion is configured in such a manner that a semiconductor region having the same polarity as a signal carrier constituting a part of the photoelectric conversion portion is taken as a source and a semiconductor region (overflow drain region: OFD region) 805 supplied with a power supply voltage is taken as drain.

The first and the second charge carrier holding portions 806, 807 are configured to hold a signal carrier generated in the photoelectric conversion portion. The first and the second charge transfer portion 808, 809 are configured to transfer charges held by the first and the second charge carrier holding portions to a circuit element at a subsequent stage. The input node 810 is an input node of an amplifying portion to be described later and is configured to hold charges to be transferred through the first and the second transfer portions from the first and the second charge carrier holding portions. The input node can use, for example, a floating diffusion region (FD region) distributed to a semiconductor substrate. The resetting portion 811 is configured to supply a reference voltage to the input node 810 of the amplifying portion. The amplifying portion 812 amplifies a signal based on a signal carrier transferred to the FD region and reads out the amplified signal to the outside. As an example, here is a source follower circuit using a MOS transistor. The amplifying portion may use such a configuration that a gate of the MOS transistor and the FD region are electrically connected to each other.

The selection portion 813 is configured to select each pixel and read the selected pixel to the outside for each pixel or for each pixel row.

Each of the transfer portion, the resetting portion, the selection portion and the charge carrier discharging control portion may use a MOS transistor.

The present embodiment is characterized by a structure of a charge carrier path between the photoelectric conversion portion and the first and the second charge carrier holding portions. The present embodiment is configured to transfer a charge from the photoelectric conversion portion to the first and the second charge carrier holding portions with such a voltage as to cause the first and the second charge transfer portions to be in a non-conduction state being supplied.

For example, as a concrete configuration, the charge carrier transfer portion is of a MOS transistor. The MOS transistor constitutes a buried channel structure. This configuration includes a portion in which an energy barrier is positioned to be lower even under a non-conduction state. In this case, the charge carrier transfer portion can also keep a constant voltage to be in a supplied state without any positive control. Specifically, a stationary potential barrier may be provided without need of having a function serving as the transfer portion.

Such a configuration allows most of signal carriers generated by photoelectric conversion when light is launched into the photoelectric conversion portion to be transferred to the first charge carrier holding portion without any accumulation in the photoelectric conversion portion. Accordingly, the photoelectric conversion portion included in all pixels allows charge accumulation time to be unified. When the MOS transistor is in a non-conduction state, a hole is accumulated in a channel surface and a channel to which a charge current is transferred exists in a portion at a predetermined depth from the surface and therefore an adverse effect of a dark current can be suppressed at an insulation film interface.

From another viewpoint, during a period in which at least one of the photoelectric conversion portion and the first and the second charge carrier holding portions accumulate signal carriers, it may be said that a potential of a charge carrier path between the photoelectric conversion portion and the charge carrier holding portion is lower than that of a charge carrier path between the photoelectric conversion portion and an OFD region. The potential used herein is a potential for a signal carrier.

From the viewpoint of drive, a charge moved to at least either one of the first and the second charge carrier holding portions from the photoelectric conversion portion during one exposure period is held and used as an image signal. Specifically, it may be said that after start of one exposure period by the photoelectric conversion portion, a signal is read out to the outside of a pixel without any reset operation of the charge carrier holding portion. One exposure period used herein refers to the one determined in common by the each photoelectric conversion portion when a one-frame image is taken.

Next, detailed description will be described on a relationship between respective configurations in one pixel. In the present embodiment, the plurality of charge carrier holding portions are provided for one photoelectric conversion portion 801 and charge holding is performed, using charge carrier holding portions different for each frame, thus attaining continuous moving image shooting.

In the same way as the embodiments described above, such a configuration is effective, particularly for a case where the photoelectric conversion portion, the charge carrier holding portion and the charge carrier path therebetween are in such a state as described above. Description of the advantages of the configuration of the present embodiment will be made, as a comparative example, on a case where moving image shooting is performed in a configuration having only one charge carrier holding portion relative to the photoelectric conversion portion.

During a period at which light is launched into the photoelectric conversion portion as described above, a predetermined amount of signal carriers generated by photoelectric conversion move from the photoelectric conversion portion to the charge carrier holding portion. However, the charge carrier holding portion may have a state where a signal carrier of a previous frame is held. This is because the signal carrier is required to be held for a fixed period by the charge carrier holding portion until a selection operation is performed for reading out to the outside for each pixel row. When a charge generated by the photoelectric conversion portion is mixed into the charge carrier holding portion under such a state, the mixed charge is a charge generated during a period which is not an original exposure period (a charge of a following frame), which causes a noise. To prevent the charge which is a cause for a noise from being mixed into the charge carrier holding portion, during a period at which the charge carrier holding portion is holding a charge carrier, the charge carrier discharging control portion requires to discharge a signal carrier generated by the photoelectric conversion portion to an OFD region. Hence, mixing of a charge into the charge carrier holding portion can be inhibited. However, if such an operation is performed, such a state where image information is missing will be made during a period at which a charge carrier is being discharged by the charge carrier discharging control portion. Therefore, a moving image tends to be taken with discontinuous frame.

On the other hand, in a configuration of the present embodiment, installation of a plurality of charge carrier holding portions (a first and a second charge carrier holding portions) in the photoelectric conversion portion allows continuous moving image shooting. Specifically, during a period at which charges generated by the photoelectric conversion portion are held by the photoelectric conversion portion and the first charge carrier holding portion, the second charge carrier holding portion can hold charges until a pixel row is sequentially selected.

Figure 9A:
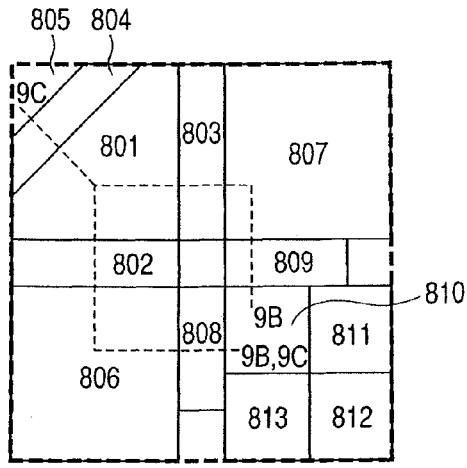
FIGS. 9A, 9B and 9C illustrate a top view and sectional views of a solid-state imaging apparatus according to the third embodiment.
Figure 9B:
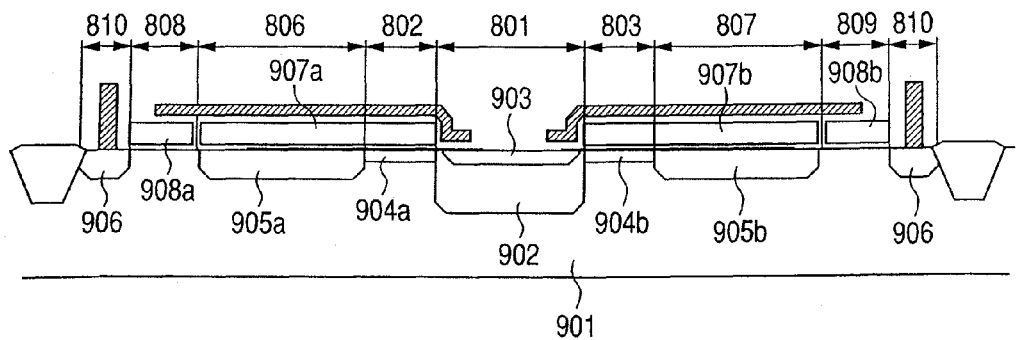
Figure 9C:
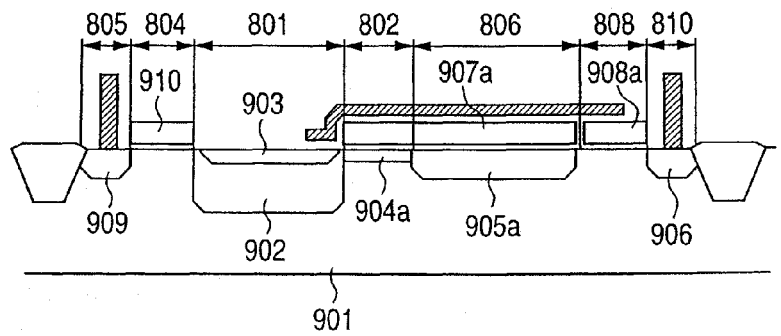

FIGS. 9A, 9B and 9C illustrate a top view and sectional views of a solid-state imaging apparatus according to the present embodiment. Portions having similar functions to those in FIG. 8 have the same reference numerals/characters and detailed description will not be repeated. In the top view of FIG. 9A, each region is rectangular for easy description, which indicates that each configuration is not always rectangular and, in the region, at least the each configuration is disposed. Other embodiments are applicable in the same way. Only one pixel is illustrated, however, such a plurality of pixels is disposed to constitute a pixel region.

The first charge carrier holding portion 806 is disposed, adjacent to the photoelectric conversion portion 801 in the first direction (downward in Figure), while the second charge carrier holding portion 807 is disposed, adjacent to the photoelectric conversion portion in the second direction (to the right in Figure) orthogonal to the first direction. Such a configuration can attain efficient arrangement of respective elements and reduction in a pixel pitch.

FIG. 9B is a sectional view taken along line 9B-9B in FIG. 9A, and FIG. 9C is a sectional view taken along line 9C-9C in FIG. 9A.

The p-type semiconductor region 901 can be formed by injecting a p-type impurity ion into an n-type semiconductor substrate. Otherwise, a p-type semiconductor substrate may be used.

The n-type semiconductor region (a first semiconductor region of a first conductivity type) 902 constitutes a part of the photoelectric conversion portion and has the same polarity as an electron which is a signal carrier, where a PN junction is constituted with the p-type semiconductor region 901 (a second semiconductor region of a second conductivity type).

The p-type semiconductor region 903 is provided on a surface of the n-type semiconductor region 902 and provided to use an embedded type photodiode as the photoelectric conversion portion, which suppresses an adverse effect of an interface state and a dark current generated on a surface of the photoelectric conversion portion. The photoelectric conversion portion includes at least the p-type semiconductor region 901 and the n-type semiconductor region 902 constituting a PN junction with the p-type semiconductor region 901.

The charge carrier path 904a, 904b are between the n-type semiconductor region 902 and n-type semiconductor regions 905a, 905b to be described later, where an n-type impurity with low concentration is doped to constitute a buried channel structure.

The n-type semiconductor regions (third and fourth semiconductor regions of a first conductivity type) 905a, 905b constitute a part of the first and the second charge carrier holding portions 806, 807 and are configured to store a charge transferred from the photoelectric conversion portion 101 for a fixed period.

The first conductivity type floating diffusion region (FD region) 906 functions as a charge voltage conversion portion and is electrically connected with a gate of an amplifying MOS transistor through a plug.

The overflow drain region 909 is a first conductivity type OFD region.

The first control electrode 907a is disposed on the n-type semiconductor region 905a through an insulation film and can control a potential state of a region in proximity to an insulation film interface, of the n-type semiconductor region 905a. By supplying a voltage to the first control electrode 907a during a period at which the first charge carrier holding portion is holding a charge, an adverse effect of dark current generated in vicinity to an interface to surface oxide film of the n-type semiconductor region 905 can be suppressed. The first charge carrier holding portion 806 includes the n-type semiconductor region 905a and the first control electrode 907a.

The first control electrode 907a is disposed, extending to the n-type semiconductor region 904a and has a function as a transfer electrode, which may be provided separately from each other.

The second control electrode 907b is disposed on the n-type semiconductor region 905b through an insulation film and can control a potential state of a region in proximity to an interface of the insulation film on the n-type semiconductor region 905b. By supplying a voltage to the second control electrode 907b during a period at which the second charge carrier holding portion 807 is holding a charge, an adverse effect of dark current generated in vicinity to an interface to surface oxide film of the n-type semiconductor region 905b can be suppressed. The second charge carrier holding portion 807 includes the n-type semiconductor region 905b and the second control electrode 907b.

The second control electrode 907b is disposed, extending to the n-type semiconductor region 904b and has a function as a transfer electrode, which may be provided separately from each other.

The third and the fourth control electrodes 908a, 908b are configured to control a potential state of a charge carrier path between the n-type semiconductor regions 905a, 905b and the FD region 906.

The charge carrier discharging control portion 910 is configured to control a potential of a charge carrier path between the n-type semiconductor region 902 and the OFD region 909 constituting the photoelectric conversion portion.

Figure 10:
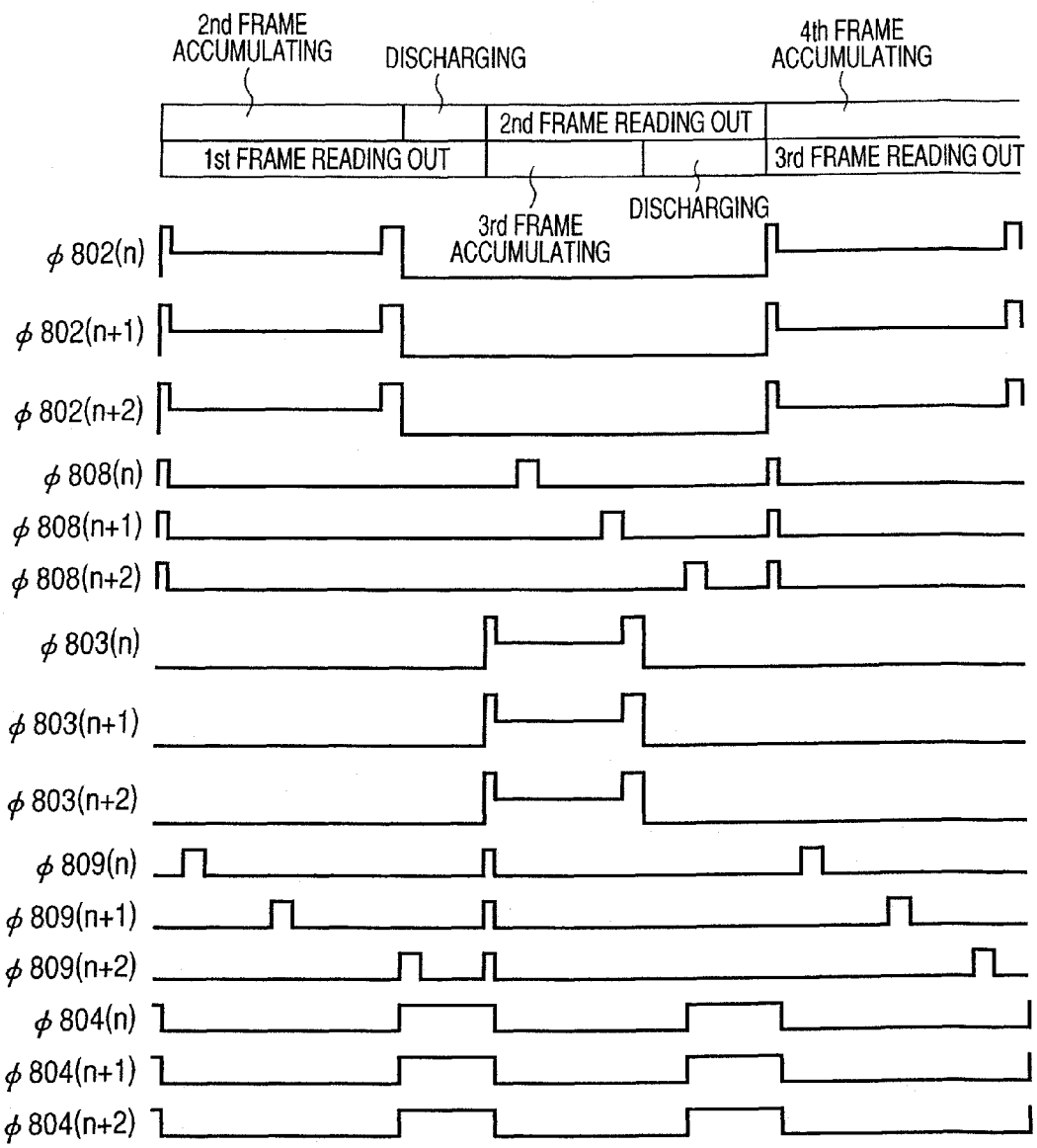
FIG. 10 illustrates a driving pulse supplied to each of the control electrode and the transfer electrode in FIGS. 8, 9A, 9B and 9C.

Referring next to FIG. 10, a driving method according to the present embodiment will be described below. FIG. 10 illustrates a progress in time series of a driving pulse supplied to each of the control electrode and the transfer electrode in FIGS. 8 and 9A to 9C. Reference numerals/characters are the same as those in FIGS. 9A to 9C. Suffixes of respective control lines show (n)th, (n+1)th and (n+2)th rows. Description will be made on only three rows herein, however, the present invention is applicable to a case of more than three rows by repeating the driving pattern and is highly active. The present embodiment is configured to give pulses of three values to Φ802. A first pulse, a second pulse and a third pulse are used in the order of pulse height.

First, initial states are completion of 1st-frame accumulating period and charges being held by the second charge carrier holding portion.

Under such states, a first pulse is supplied to Φ802 in all rows and a conduction pulse is supplied to Φ808 and Φ804. This operation discharges charges of the photoelectric conversion portion and the first charge carrier holding portion to the OFD region. By bringing a resetting portion (not illustrated) into electrical connection, charges of the FD region 810 and the first charge carrier holding portion may be discharged to a resetting power supply. At this time, a third pulse is supplied to Φ803 and the second charge transfer portion 803 is in a non-conduction state. Subsequently, a second pulse is supplied to Φ802 and a pulse to be brought into electrical non-conduction is supplied to Φ808. This operation starts accumulation of 2nd-frame signal carriers in the photoelectric conversion portion and the first charge carrier holding portion. By supplying a second pulse to Φ802, a charge carrier path in the first charge transfer portion exists in a region buried inside a substrate at a predetermined distance from a surface (Buried channel).

Next, a conduction pulse is supplied to Φ809 in row order. Hence, a signal carrier held by the second charge carrier holding portion is transferred to an input portion of the amplifying portion to bring the selection portion into electrical connection, thus reading out a signal to the outside. This is a first frame reading-out operation. As described above, during 1st-frame reading-out operation, light is launched into the photoelectric conversion portion for photoelectric conversion, which reaches 2nd-frame accumulating period.

After lapse of 2nd-frame accumulating period, a first pulse is supplied to Φ802 in all rows and 2nd-frame signal carrier left in the photoelectric conversion portion is transferred to the first charge carrier holding portion in a collective manner. This operation completes the 2nd-frame accumulating period. Next, a conduction pulse is supplied to Φ804. Φ804 is kept in electrical connection until a 3rd-frame accumulating start period. The electrical connection period of Φ804 may be changed depending upon the accumulating period (exposure period) of each frame.

Next, a conduction pulse is supplied to Φ808 in row order. This operation transfers a signal carrier held by the first charge carrier holding portion to an input portion of the amplifying portion and reads out a signal by bringing the selection portion into electrical connection. This is a 2nd frame reading-out operation. During 2nd-frame reading-out operation period, light is launched into the photoelectric conversion portion for photoelectric conversion, thus taking a 3rd-frame accumulating period. With a conduction pulse being supplied to Φ804, the 3rd-frame accumulation is started by supplying a non-conduction pulse to Φ804, a second pulse to Φ803 and a non-conduction pulse to Φ809 after supplying a first pulse to Φ803 and a conduction pulse to Φ809, respectively. By supplying a second pulse to Φ803, a charge carrier path in the second charge transfer portion exists in a region buried inside a substrate at a predetermined distance from a surface (Buried channel).

Repeating this operation allows moving image shooting. As described above, the accumulating period of each frame can be set as needed from conduction periods of Φ104 and Φ804.

Figure 11:
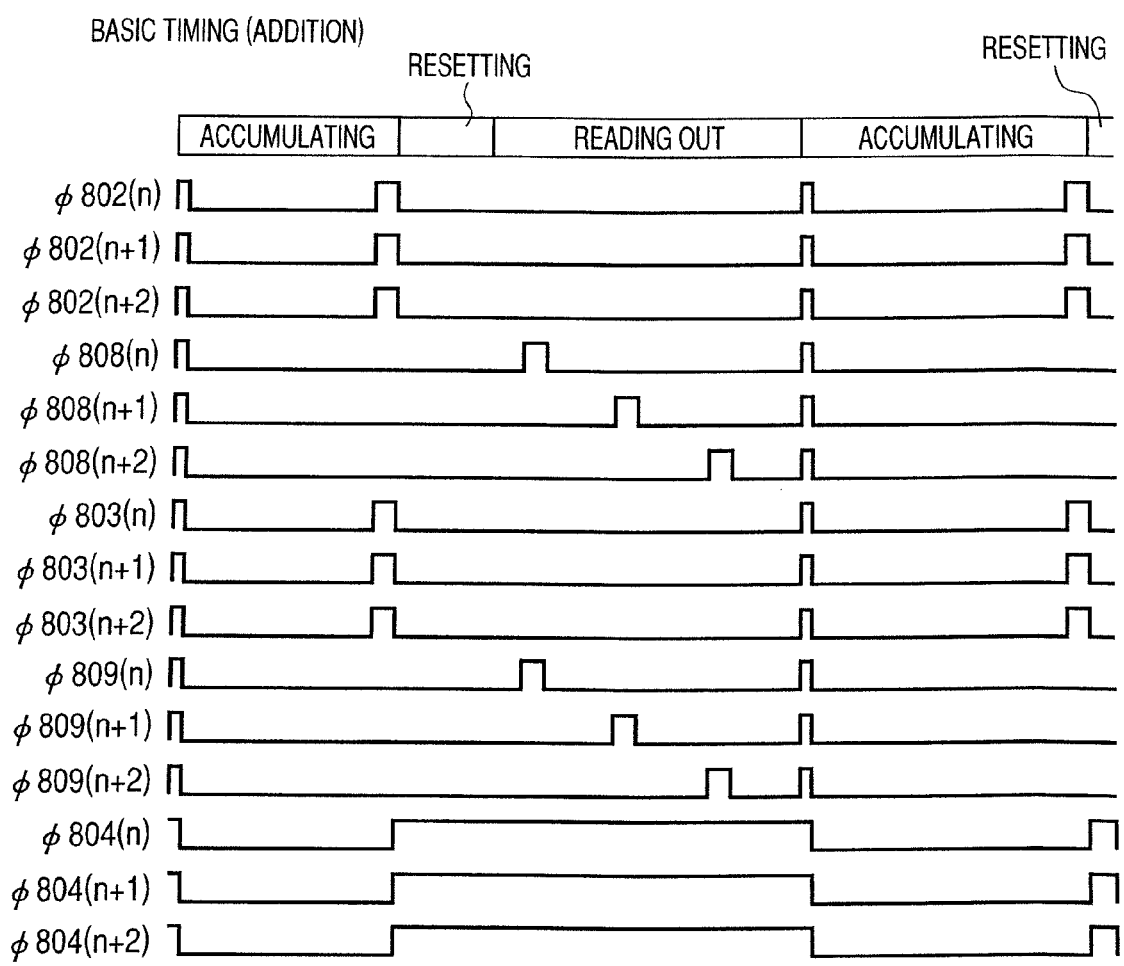
FIG. 11 illustrates a driving pulse supplied to each of the control electrode and the transfer electrode.
Figure 12:
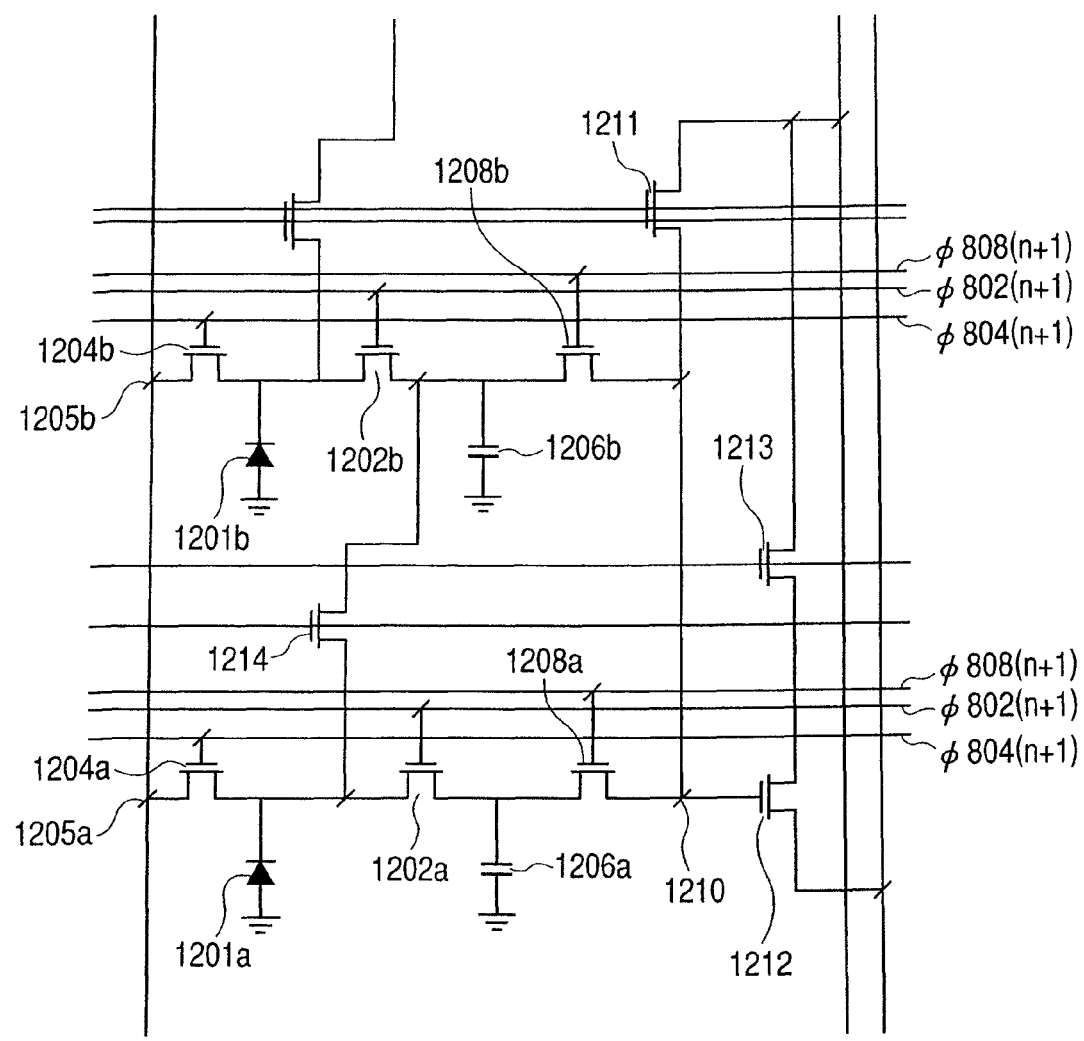
FIG. 12 illustrates an equivalent circuit diagram of a solid-state imaging apparatus according to the fourth embodiment.

Referring next to FIG. 11, description will be made on a drive method appropriate to still image shooting. FIG. 4 illustrates an example used as an image signal by adding charges held by the first and the second charge carrier holding portions. In FIG. 10, a ternary pulse was supplied to Φ802, Φ803, however, a binary pulse may be used in this example. For description, a first pulse and a second pulse are taken in descending order of pulse height.

First, a first pulse is supplied to Φ802 and Φ803 and a conduction pulse is supplied to Φ808, Φ809 and Φ804. Subsequently, a second pulse is supplied to Φ802, Φ803 and a non-conduction pulse is supplied to Φ808, Φ809 and Φ810. This operation allows the photoelectric conversion portion, the first charge carrier holding portion and the second charge carrier holding portion to store a signal carrier. After lapse of a predetermined accumulating period, a first pulse is supplied to Φ802, Φ803 and a signal carrier left in the photoelectric conversion portion is transferred to the each charge carrier holding portion. Subsequently, by bringing Φ804 into electrical connection, a charge of the photoelectric conversion portion is discharged to the OFD region. By bringing the resetting portion (not illustrated) into electrical connection, a reference voltage is supplied to the FD region. Subsequently, by concurrently bringing Φ808, Φ809 in the same row into electrical connection, addition of a signal carrier is made in the FD region and a signal is read out to the outside. According to the reading-out method in FIG. 11, particularly during still image shooting, shooting can be made with a more expanded dynamic range.

Driving methods in FIGS. 10 and 11 can be used by switching, for example, in switching moving image shooting and still image shooting.

As described above, according to the present embodiment, even in such a configuration that a signal carrier moves to and is accumulated in the charge carrier holding portion during an exposure period, shooting by electronic shutter operation can be performed without causing any break in a shooting period.

Fourth Embodiment

FIGS. 5A to 5C and 12 illustrate an equivalent circuit diagram of a solid-state imaging apparatus according to the present embodiment. The difference from the first embodiment is that an output node of a first photoelectric conversion portion is electrically connectable with a plurality of charge carrier holding portions through a transfer portion. That is, a first charge carrier holding portion provided corresponding to a second photoelectric conversion portion can be used as a second charge carrier holding portion of the first photoelectric conversion portion. In the present embodiment, one set of operations is made in two pixel rows and a charge generated by the photoelectric conversion portion in one row is always discharged though an OFD.

In FIGS. 5A to 5C and 12, there are the first photoelectric conversion portions 501a, 1201a and the second photoelectric conversion portions 501b, 1201b. The charge carrier holding portions 506a, 1206a are mounted corresponding to the first photoelectric conversion portions 501a, 1201a. In addition, the charge carrier holding portions 506b, 1206b are mounted corresponding to the second photoelectric conversion portions 501b, 1201b. Hereinafter, for convenience sake, the reference characters 506a, 1206a are taken as the first charge carrier holding portions and the reference characters 506b, 1206b are taken as the second charge carrier holding portions.

First charge carrier transfer portions 502a, 1202a are arranged between output nodes O-nodes of the first photoelectric conversion portions 501a, 1201a and the first charge carrier holding portions 506a, 1206a. Further, second charge carrier transfer portions 514, 1214 are arranged between the output nodes O-nodes of the first photoelectric conversion portions 501a, 1201a and the second charge carrier holding portions 506b, 1206b. Arranging the second charge carrier transfer portions 514, 1214 enables a signal carrier from the first photoelectric conversion portion to be held in the first and second charge carrier holding portions. This configuration, as in the first embodiment, allows a signal carrier in a first frame to be held in the first charge carrier holding portions 506a, 1206a and a signal carrier in a second frame after the first frame in terms of time to be held in the second charge carrier holding portion 506b, 1206b.

In addition, there are the charge carrier transfer portions 502, 1202, charge carrier discharging control portions 504, 1204, OFD regions 505, 1205, charge carrier holding portions 506, 1206, first transfer portions 508, 1208, FD regions 510, 1210, resetting portions 511, 1211, amplifying portions 512, 1212 and selection portions 513, 1213. A suffix "a" is added to the configuration provided corresponding to the first photoelectric conversion portions and a suffix b is added to the configuration provided corresponding to the second photoelectric conversion portions. No suffix is added to a configuration commonly provided on the first and second photoelectric conversion portions. Each of the configurations has a similar function to that of the first embodiment.

Figure 13:
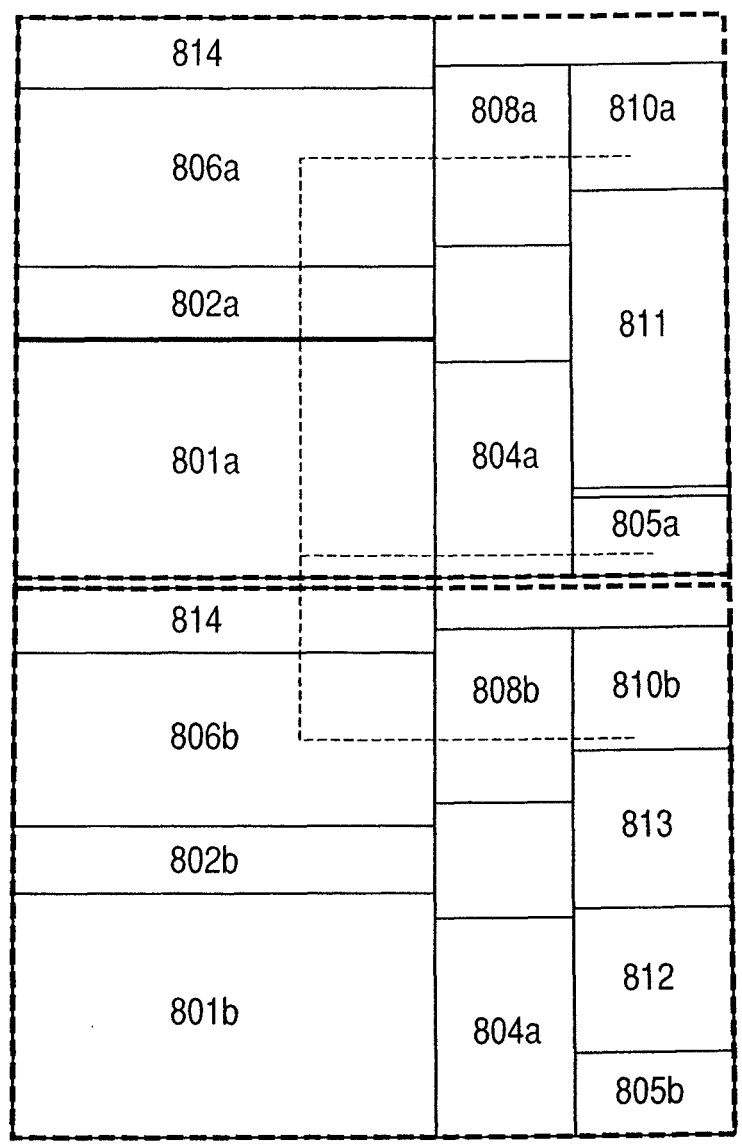
FIG. 13 illustrates a top view and a sectional view of a solid-state imaging apparatus according to the fourth embodiment.

FIGS. 6 and 13 are a top view and a sectional view of a solid-state imaging apparatus according to the present embodiment. Portions having similar functions to those in FIGS. 5A to 5C and 12 have the same reference numerals/characters and detailed description will not be repeated.

The first charge carrier holding portions 506a, 1206a and the second charge carrier holding portions 506b, 1206b are arranged through the charge carrier transfer portions in the vertical directions of the drawings for the first photoelectric conversion portions 501a, 1201a.

The charge carrier transfer portions 502a, 1202a, 1202b, 1114, 1214 are doped with n-type impurities with low concentration to constitute a buried channel structure.

Figure 14:
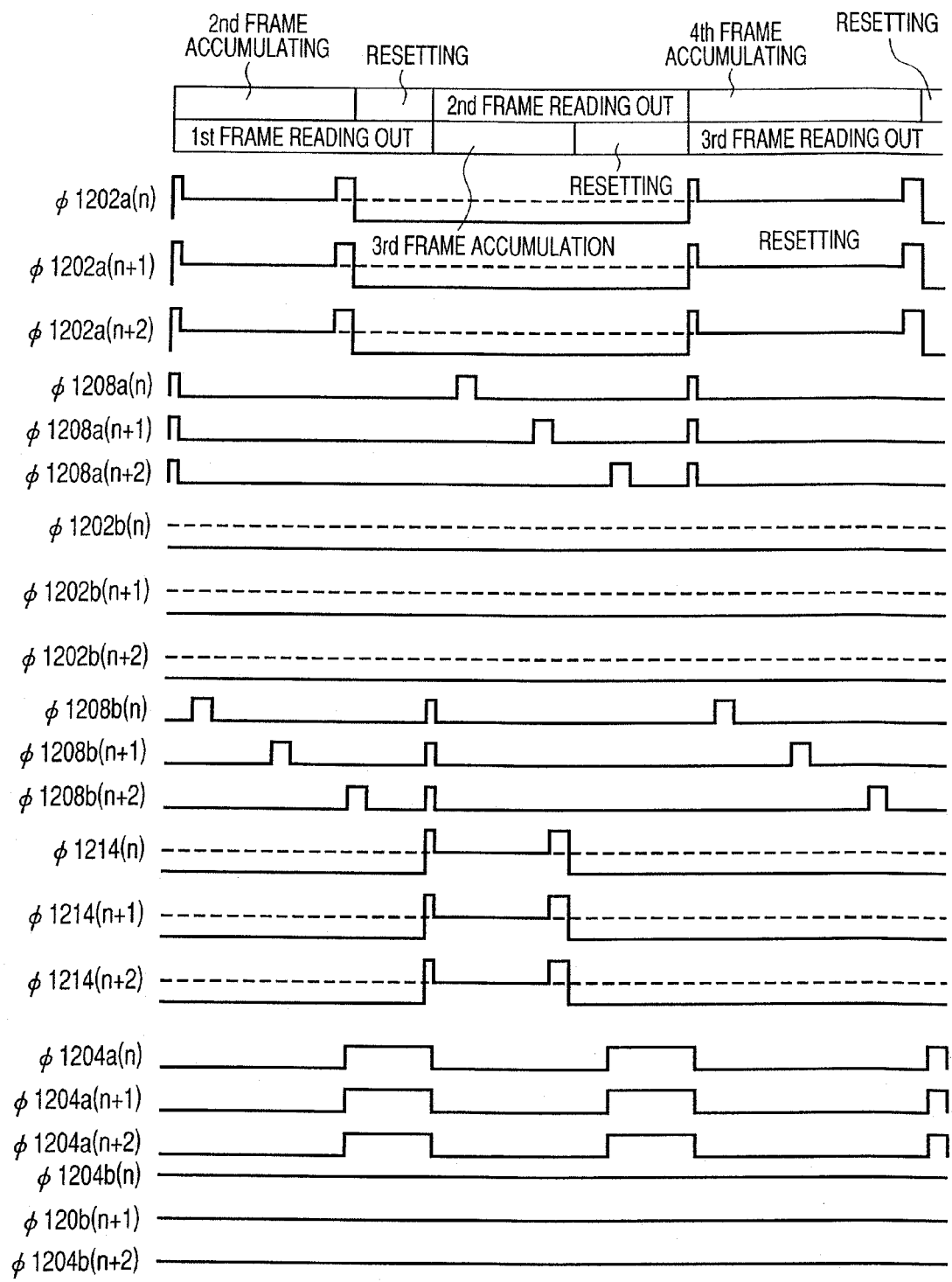
FIG. 14 illustrates a driving pulse according to the fourth embodiment.

Referring next to FIGS. 7 and 14, a drive method for the solid-state imaging apparatus according to the present embodiment will be described. Differences from the embodiments described above will be mainly described and overlapped description will not be repeated.

A ternary pulse can be supplied to Φ1202a, Φ1214 in FIG. 3, respectively. During a first-frame reading-out period and during the subsequent frame or a second frame accumulating period, a first-frame signal is held in the second charge carrier holding portion and a second-frame signal is held in the first charge carrier holding portion. Accordingly, a third pulse is supplied to Φ1202b, Φ1214 and is strongly turned off and hence a charge carrier will not flow into the second charge carrier holding portion. On the other hand, a second pulse is supplied to Φ1202a and hence a charge carrier generated by the photoelectric conversion portion flow into the first charge carrier holding portion. During this period, a pulse is sequentially supplied to Φ1208b for each row and a charge carrier of the charge carrier holding portion is transferred to the FD region. When transferring a row requiring reading-out has been completed, the resetting portion is brought into electrical connection to reset the charge carrier in the FD region.

Next, during the second-frame reading-out period and during the third-frame accumulating period, a third pulse is supplied to Φ1202a and strongly turned off, while a second pulse is supplied to Φ1214 and a charge carrier in the third frame is accumulated in the second charge carrier holding portion. At the same time, a pulse is sequentially supplied to Φ1208a for each row and a second-frame frame charge carrier held by the first charge carrier holding portion is transferred to the FD region.

Repeating such operations reduces the number of rows used for image formation, but an image can be attained without any break.

According to the purposes, drive in FIG. 14 and drive using the first and second charge carrier holding portions for charge carrier holding in respective photoelectric conversion portions may be selectively used. For example, drive in FIG. 14 is used for obtaining a moving image, while drive using the first and second charge carrier holding portions for charge carrier holding in the photoelectric conversion portions respectively corresponding to is used in such a case as to require high resolution like still-flame pictures.

Further, charge carriers generated by the two photoelectric conversion portions may be added by supplying a pulse in synchronization with the Φ1202*a*, Φ1202*b* to the Φ1214.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-120408, filed May 2, 2008, which is hereby incorporated by reference herein in its entirety.

The invention claimed is:

1. A solid-state imaging apparatus comprising a plurality of pixels each including
   a first photoelectric conversion portion;
   a first holding portion for holding signal carriers from the first photoelectric conversion element;
   a second photoelectric conversion portion;
   a second holding portion for holding signal carriers from the second photoelectric conversion element;
   a first transfer portion for controlling an electrical connection between the first holding portion and the second charge holding portion
   an amplifying portion for amplifying and reading a signal based on the signal carriers held in at least one of the first and second holding portions; and
   a carrier discharging control portion for controlling an electrical connection between the first and second photoelectric conversion portions and an overflow drain region, wherein
   a carrier path between the first photoelectric conversion portion and the first holding portion, and a carrier path between the second photoelectric conversion portion and the second holding portion are formed in a buried channel structure.

2. The solid-state imaging apparatus according to claim 1, further comprising:
   a second transfer portion, arranged in a carrier path between the first holding portion and an input node of the amplifying portion, for controlling an electrical connection between the second holding portion and the amplifying portion.

3. A solid-state imaging apparatus comprising a plurality of pixels each including
   a first photoelectric conversion portion;
   a first holding portion for holding signal carriers from the first photoelectric conversion portion;
   a second photoelectric conversion portion;
   a second holding portion for holding signal carriers from the second photoelectric conversion portion;
   a first transfer portion for controlling an electrical connection between the first holding portion and the second holding portion
   an amplifying portion for amplifying and reading a signal based on the signal carriers held in at least one of the first and second holding portions; and
   a carrier discharging control portion for controlling an electrical connection between the first and second photoelectric conversion portions and an overflow drain region, wherein
   wherein a potential, as to the signal carriers, of a carrier path between the first photoelectric conversion portion and the first holding portion during a period of accumulating the signal carriers in the first photoelectric conversion portion and the first holding portion is not higher than a potential, as to the signal carriers, of a carrier path between the first photoelectric conversion portion and the overflow drain region.

4. The solid-state imaging apparatus according to claim 3, further comprising:
   a second transfer portion, arranged in a carrier path between the first holding portion and an input node of the amplifying portion, for controlling an electrical connection between the second holding portion and the amplifying portion.

* * * * *